(12) United States Patent
Miyata

(10) Patent No.: US 9,490,184 B2
(45) Date of Patent: Nov. 8, 2016

(54) LIGHT EMITTING DEVICE AND MANUFACTURING METHOD THEREOF

(71) Applicant: NICHIA CORPORATION, Anan-shi, Tokushima (JP)

(72) Inventor: Tadaaki Miyata, Yokohama (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/802,095

(22) Filed: Jul. 17, 2015

(65) Prior Publication Data

US 2015/0325489 A1 Nov. 12, 2015

Related U.S. Application Data

(62) Division of application No. 14/141,728, filed on Dec. 27, 2013, now Pat. No. 9,117,689.

(30) Foreign Application Priority Data

Dec. 28, 2012 (JP) ................................. 2012-288784

(51) Int. Cl.

| H01L 33/00 | (2010.01) |
|---|---|
| H01L 21/66 | (2006.01) |
| H01L 33/08 | (2010.01) |
| H01L 33/46 | (2010.01) |

(Continued)

(52) U.S. Cl.
CPC .......... *H01L 22/22* (2013.01); *H01L 25/0753* (2013.01); *H01L 33/005* (2013.01); *H01L 33/08* (2013.01); *H01L 33/46* (2013.01); *H01L 33/486* (2013.01); *H01L 33/502* (2013.01); *H01L 33/54* (2013.01); *H01L 33/56* (2013.01); *H01L 33/62* (2013.01); *H05K 3/225* (2013.01); *H01L 2924/0002* (2013.01); *H01L 2933/005* (2013.01); *H01L 2933/0025* (2013.01); *H01L 2933/0033* (2013.01); *H01L 2933/0041* (2013.01); *H01L 2933/0066* (2013.01); *H05K 3/284* (2013.01); *H05K 2201/10106* (2013.01)

(58) Field of Classification Search
CPC ...................................................... H01L 22/22
See application file for complete search history.

(56) References Cited

U.S. PATENT DOCUMENTS

| 6,287,907 B1 | 9/2001 | Ito et al. |
|---|---|---|
| 6,576,484 B1 | 6/2003 | Birdsley et al. |

(Continued)

FOREIGN PATENT DOCUMENTS

| JP | 2003-011415 A | 1/2003 |
|---|---|---|
| JP | 2003-191521 A | 7/2003 |

(Continued)

OTHER PUBLICATIONS

Herbst, Wolfgang, "The Back-end process: Step 5—Flip Chip attach Process and Material Options", Solid State Technology, http://electroiq.com/blog/2002/05/the-back-end-process-step-5-flip-chip-attachbrprocess-and-material-options/.

*Primary Examiner* — William Harriston
(74) *Attorney, Agent, or Firm* — Foley & Lardner LLP

(57) ABSTRACT

The light-emitting device has a plurality of light-emitting elements that is mounted on one or more wiring patterns on a substrate. A new light-emitting element that replaces a defective element is mounted on the same wiring pattern on which the defective element is mounted. The defective element or a trace that remains alter removal of the defective element is sealed by a same sealing member by which the new light-emitting element is sealed.

21 Claims, 6 Drawing Sheets

(51) Int. Cl.
  *H01L 33/48*   (2010.01)
  *H01L 33/56*   (2010.01)
  *H01L 33/50*   (2010.01)
  *H01L 25/075*  (2006.01)
  *H01L 33/54*   (2010.01)
  *H01L 33/62*   (2010.01)
  *H05K 3/22*    (2006.01)
  *H05K 3/28*    (2006.01)

(56) References Cited

U.S. PATENT DOCUMENTS 8,022,431 B2   9/2011   Kaneko et al.
8,710,513 B2   4/2014   Yoo et al.

2003/0011377 A1* 1/2003 Oohata ............... G09G 3/006
                                                324/512
2005/0247944 A1  11/2005 Haque et al.
2013/0277707 A1  10/2013 Miyata
2014/0001419 A1*  1/2014 Namiki ................ H01R 4/04
                                                252/513
2014/0061684 A1   3/2014 Marutani et al.

FOREIGN PATENT DOCUMENTS

JP   2005-322937 A   11/2005
JP   2006-134996 A    5/2006
JP   2009-088190 A    4/2009
JP   2012-094578 A    5/2012
JP   2012-104594 A    5/2012

* cited by examiner

LIGHT EMITTING DEVICE AND MANUFACTURING METHOD THEREOF

CROSS REFERENCE TO RELATED APPLICATIONS

This application is a divisional of U.S. application Ser. No. 14/141,728, filed Dec. 27, 2013 which claims priority to Japanese Application No. 2012-288784, filed Dec. 28, 2012 the disclosures of which are hereby incorporated by reference in its entirety.

BACKGROUND OF THE INVENTION

1. Field of the Invention

The present disclosure relates to a light-emitting device and a manufacturing method thereof.

2. Description of the Related Art

Conventionally, light-emitting devices in which a plurality of light-emitting elements are mounted on a substrate have been proposed (refer to Japanese Patent Application Publication No. 2005-322937).

The conventional light-emitting device, however, has to be scrapped in a case that one of the plurality of light-emitting elements is defective.

SUMMARY OF THE INVENTION

In one embodiment, a light-emitting device is provided in which a plurality of light-emitting elements is mounted on one or more wiring patterns on a substrate. The plurality of light-emitting elements includes a new light-emitting element that replaces a defective element and the new light-emitting element is mounted on the same wiring pattern on which the defective element is or was mounted. The defective element or a trace of the defective element that remains after removal of the defective element is sealed by a same sealing member by which the new light-emitting element is sealed.

Another aspect of the invention relates to a method for manufacturing a light-emitting device. The method includes mounting a plurality of light-emitting elements on one or more wiring patterns on a substrate, mounting a new light-emitting element that replaces a defective element of the plurality of light-emitting elements on the same wiring pattern on which the defective element is or was mounted, sealing the new element with a sealing member, and sealing the detective element or a trace of the defective element that remains after removal of the defective element by a same sealing member by which the new light-emitting element is sealed.

DETAILED DESCRIPTION

Hereinafter, embodiments will be described with reference to the accompanying drawings.

[Light-Emitting Device]

Figure 1A:
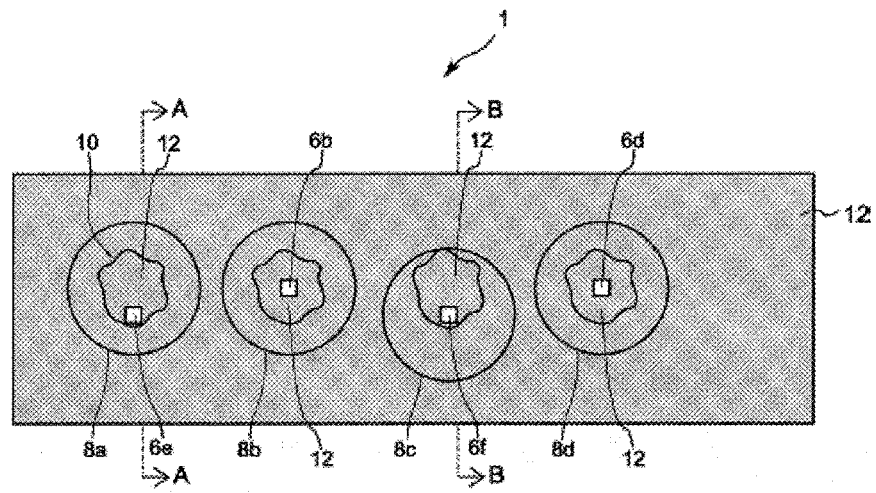
FIGS. 1A-1C are diagrams illustrating the schematic configuration of a light-emitting device according to an embodiment.
Figure 1B:
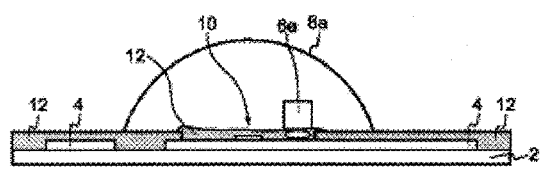
Figure 1C:
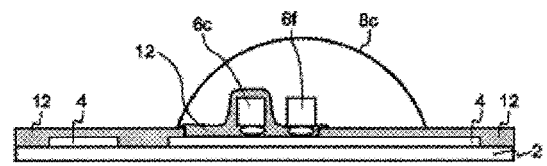

FIGS. 1A-1C are diagrams illustrating the schematic configuration of a light-emitting device according to an embodiment. FIG. 1A is a perspective-view diagram, FIG. 1B is a diagram illustrating a cross-section A-A in FIG. 1A, and FIG. 1C is a diagram illustrating a cross-section B-B in FIG. 1A.

As illustrated in FIGS. 1A-1C, a light-emitting device 1 according to an embodiment is a light-emitting device in which a plurality of light-emitting elements 6e, 6b, 6f, 6d are mounted on one or more wiring patterns 4 on a substrate 2.

The light-emitting elements 6e, 6f among the plurality of light-emitting elements 6e, 6b, 6f, 6d are new light-emitting elements that replace defective elements 6a, 6c. The defective element 6a is removed from the substrate 2, and does not appear in FIGS. 1A-1C.

Among the defective elements 6a, 6c, the defective element 6a is a defective element that causes an electrical short-circuit, and is removed from the substrate 2. On the other hand, the defective element 6c is a defective element that is not electrically connected to the circuit, and is not removed from the substrate 2.

A trace 10 that remains after removal of the defective element. 6a is covered by a reflective member 12 to make up for the drop in reflectance this is caused by the removal of the defective element 6a. A die bonding mark and/or a die bonding material residue are examples of the trace 10. The defective element 6c is covered by the reflective member 12 to make up for the drop in reflectance that is caused by the presence of the defective element 6c.

The defective element 6a is removed and the defective element 6c is covered by the reflective member 12. Therefore, the defective elements 6a, 6c do not appear on the light-emitting surface side of the light-emitting device 1.

The new light-emitting elements 6e, 6f are mounted on the same wiring pattern 4 on which the defective elements 6a, 6c are mounted, adjacent to the sites at which the defective elements 6a, 6c are mounted. That is, the new light-emitting elements 6e, 6f are mounted adjacent to the sites at which the light-emitting elements are originally intended to foe mounted. The trace 10 that remains after removal of the defective element 6a is sealed by the same sealing member 8a by which the new light-emitting element 6e is sealed. The defective element 6c is sealed by the same sealing member 8c by which the new light-emitting element 6f is sealed.

Therefore, the embodiment allows preventing the emission, points of new light-emitting elements 6e, 6f from being offset from the emission points of the defective elements 6a, 6c (i.e. allows maintaining the positions of the initial emission points as much as possible), and allows mitigating the influence on optical performance derived from providing a new light-emitting element instead of a defective element such as the drop of output of the light-emitting device 1 in which a lens-like sealing member 8 is provided.

Therefore, according to the embodiment, it becomes possible to use the light-emitting device 1 that was conventionally scrapped by reason of that a plurality of light-emitting elements include a defective element.

When the new light-emitting elements 6e, of are mounted on the same wiring pattern 4 on which the defective elements 6a, 6c are mounted, there is no longer a need to provide, newly or beforehand, a spare wiring pattern 4 for mounting the new light-emitting elements 6e, 6f. Accordingly, it becomes possible to simplify the wiring pattern 4, and to provide a small light-emitting device at a low cost and with a high degree of design freedom.

Members of the light-emitting device 1 according to the embodiment will be described below.

(Substrate 2)

Various members can be appropriately used as the substrate 2. For example, a member in which paper is impregnated with a phenolic or epoxy resin or a member in which a band-like resin or metal is used as a base are examples of the substrate 2.

An insulating material or a conductive member such as an elongate tape-like copper foil or aluminum foil covered by an insulating material are examples of the substrate 2. An insulating resin such as polyimide, PET, PEN or the like is an example of the insulating material.

The thickness of the substrate is not particularly limited. A range from about 10 μm to 2 mm is an example of the thickness of the substrate.

The shape and size of the area of the substrate 2 are not particularly limited. For example, plate-like, sheet-like (tape-like, film-like), rod-like, pipe-like, wire-like, band-like shapes and the like are examples of the shape. The light-emitting device 1 can be produced in accordance with a roll-to-roll method when a flexible band-like substrate is used as the substrate 2.

(Wiring Pattern 4)

A metal such as copper, aluminum, nickel, iron, gold, silver or the like, or an alloy thereof; or plating, a conductive paste, a conductive ink comprising the foregoing metals; or solder formed out of tin, silver, copper, gold, bismuth, zinc, lead or the like are examples of the one or more wiring patterns 4.

Preferably, the one or more wiring patterns 4 is/are provided in such a manner that the new light-emitting elements 6e, 6f can be mounted adjacent to the defective elements 6a, 6c. In this case, the sites of the new light-emitting elements 6e, of become closer to the sites of the defective elements 6a, 6c, and the defective element 6c and/or the trace 10 that arises after removal of a defective element 6a is readily sealed by the same sealing members 8a, 8c by which the new light-emitting elements 6e, 6f are sealed.

On the one or more wiring patterns 4, a pattern for self-alignment that is used during mounting of the light-emitting element and/or another positioning patterns may be provided. In this case, the new light-emitting elements 6e, 6f that replace the defective elements 6a, 6c and the original light-emitting element 6a, 6b, 6c, 6d are readily mounted. Cutouts or protrusions having a width identical or close to a width of the electrodes of the light-emitting elements are examples of the pattern tor self-alignment.

(Light-Emitting Elements 6a to 6f)

Various light-emitting diodes such as surface mounted-type LEDs, LED chips, chip-size package LEDs or the like can be used as the light-emitting elements 6a to 6f. When LED chips are used, costs can be particularly reduced.

The light-emitting elements 6a to 6f can be electrically connected to the one or more wiring patterns 4 by various methods such as flip-chip mounting using bumps or solder and wire bonding using wires.

Unlike by mounting using solder, it is usually difficult to mount light-emitting elements over a plurality of times at the same site by flip-chip-type ultrasonic mounting using bumps.

However, according to the light-emitting device 1 of the embodiment, the new light-emitting elements 6e, 6f are mounted at the sites that ate different from the sites at which the defective elements 6a, 6c are mounted, and then the defective element 6c and the trace 10 that arises after removal of a defective element 6a are readily sealed by the same sealing members 8a, 8c by which the new light-emitting elements 6e, 6f are sealed.

In the embodiment, therefore, the new light-emitting elements 6e, 6f that replace the defective elements 6a, 6c can be easily mounted also by flip-chip-type ultrasonic mounting using bumps.

Various light-emitting elements that do not allow attaining a desired goal are regarded as the detective elements. For example, light-emitting elements that exhibit a characteristic such as voltage rise, voltage drop, or drop in brightness are examples of the defective elements.

Depending on the state of the defect, the defective element may be removed from the substrate 2, or may be left mounted on the substrate 2 without being removed. For example, in a case that a defective element is a defective element that is not electrically connected to the one or more wiring patterns 4 on account of an electric junction defect or the like (open failure), the influence on electric performance is small even if a new light-emitting element that replaces the defective element is mounted without removal of the defective element. Accordingly, the defective element need not be removed in this case (refer to light-emitting element 6c in FIGS. 1A and 1C). In a case that the defective elements are not removed, no process is required for removing the defective elements, and the number of processes can be reduced.

(Sealing Members 8a, 8b, 8c, 8d)

A transparent resin such as epoxy resin, silicone resin or modified types thereof can be used as the sealing members 8a, 8b, 8c, 8d.

Preferably, the sealing members 8a, 8b, 8c, 8d include a wavelength conversion member such as phosphors quantum dots, a light diffusion member that diffuses a light and the like.

For example, a phosphor such as an oxide-based, sulfide-based or nitride-based phosphor can be used as the wavelength conversion member. In a case that a gallium nitride-based light-emitting element that emits blue light is used as the light-emitting elements, it is preferable to use, singly or in combination, a YAG-based or LAG-based phosphor that emits yellow to green light upon absorption of blue light, a SiAlON-based phosphor that emits green, light, or a SCASN-based or CASN-based phosphor that emits red light.

In particular, a combination of a SiAlON-based phosphor and a SCASN phosphor is preferably used as the wavelength conversion member in a light-emitting device that is used in a display device such as a liquid crystal display or a backlight of a television set. A combination of a YAG-based or LAG-based phosphor and a SCASN-based or CASN-based phosphor is preferably used as the wavelength conversion member in a light-emitting device for illumination applications.

For example, barium sulfate, titanium oxide, aluminum oxide or silicon oxide can be used as a light scattering member.

The abovementioned wavelength conversion member and light scattering member can be included in a member that is different from the sealing members 8a, 8b, 8c, 8d. For example, members provided at a distance from the sealing members 8a, 8b, 8c, 8d in the light-emitting device 1 or members that are provided separately from the light-emitting device 1 (for example, covers, sheets and the like that are attached to an illumination device or a liquid crystal display) are examples of those different members.

When the wavelength conversion member is provided in the sealing members 8a, 8b, 8c, 8d, the light emitted by the light-emitting elements strikes on the wavelength conversion member and then is diffused. In this case, by covering the die bonding mark, defective element and so on in the sealing members 8a, 8b, 8c, 8d with the reflective member 12, the influence on emission is reduced. On the other hand, in a case that the wavelength conversion member is not provided in the sealing members 8a, 8b, 8c, 8d (i.e. in a case that the wavelength conversion member is provided in a member that is provided spaced apart from the sealing members 8a, 8b, 8c, 8d, or in a member that is provided separately from the light-emitting device 1), the influence on light emission can be reduced by covering at least part of the die bonding mark, the defective elements and so on.

Preferably, the shape of the sealing members 8a, 8b, 8c, 8d is a shape that has a lens effect. In this case, luminance can be enhanced.

In the embodiment, an example has been illustrated wherein each sealing member 8a, 8b, 8c, 8d seals one respective light-emitting element 6e, 6b, 6f, 6d. However, two or more light-emitting elements can be sealed collectively by one sealing member. In this case, two or more light-emitting elements may be sealed by one sealing member together with two or more traces 10 and the defective element 6c.

(Trace 10)

Die bonding marks, wire bonding marks, die bonding material residues and/or wire residues are examples of the trace 10 that remains after removal of the defective element 6a.

Die bonding marks and wire bonding marks are marks that indicate where a defective element was die-bonded or wire-bonded. Debris of a joining member that joins the one or more wiring patterns 4 and the light-emitting element 6, alloy layer residues with the joining member, uplift of members that are used, in the wiring pattern 4, peeling of the one or more wiring patterns 4, bonding marks and dents from wiring wires and junctions with light-emitting elements and/or ruggedness of the one or more wiring patterns 4 are examples of die bonding marks and wire bonding marks. The alloy layer residue denotes an alloy layer of solder or wiring material from ultrasound joining and wire metal or die bonding material joined to the writing pattern. Die bonding materials and wire material residues denote residues of members that are used daring die bonding and wire bonding of the defective elements.

(Reflective member 12)

A white member that contains a white filler or white powder can be used as the reflective member 12. For example, insulating resins having high reflectance, high heat resistance and high light resistance is an example of such white member. More specifically, silicone resins that contain titanium oxide, silicon oxide, barium sulfate, aluminum oxide or the like, modified types of thereof, and/or resists are examples of such white member. The reflective member 12 may contain the above-described wavelength conversion member.

As illustrated in FIG. 1C, the reflective member 12 may be used as an underfill material that is filled in under the flip-chip-mounted light-emitting element 6f. In this case, the defective element 6c is covered by underfill. In this case, the defective element 6c is prevented from appearing on the surface of the substrate 2 without increasing the number of process, and it becomes possible to provide the light-emitting device 1 at a low cost.

The reflective member 12 can be provided over the entire surface of the substrate 2. In this case, it is preferable that the reflective member has functionality as resist.

The reflective member 12 can be provided between the sealing members 8a, 8b, 8c, 8d and the one or more wiring patterns 4.

[Manufacturing Method]

FIGS. 2A to 2E, 3A-3E and 4A-4E are diagrams illustrating schematic processes of a method for manufacturing a light-emitting device according to the embodiment. In the figures, FIGS. 2A-2E are plan-view diagrams, FIGS. 3A-3E are diagrams of a cross-sect ion A-A in FIGS. 2A-2E, respectively, and FIGS. 4A-4E are diagrams of a cross-section B-B in FIGS. 2A-2E, respectively.

As illustrated in FIGS. 2A to 2E, 3A-3E and 4A-4E, the manufacturing method of the light-emitting device 1 according to the embodiment has the following processes.

(First Process)

Figure 2A:
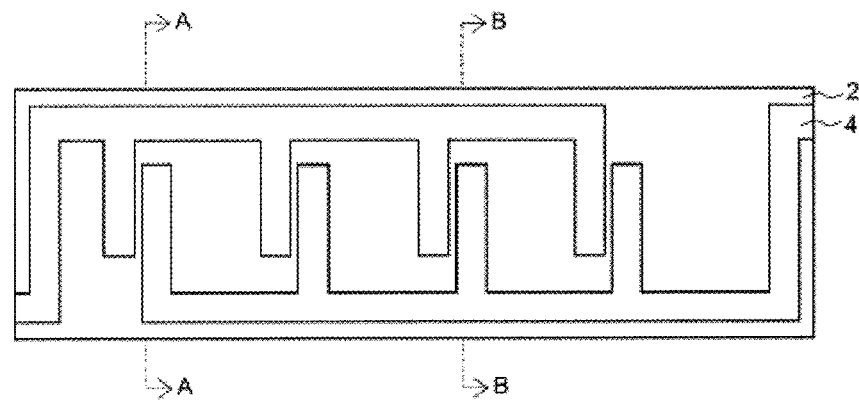
FIGS. 2A, 3A AND 4A form a set of diagrams illustrating a schematic process of a method for manufacturing a light-emitting device according to an embodiment.
Figure 3A:
Figure 4A:
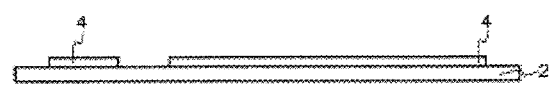

First, the substrate 2 provided with the one or more wiring patterns 4 is prepared as illustrated in FIGS. 2A, 3A and 4A.

(Second Process)

Figure 2B:
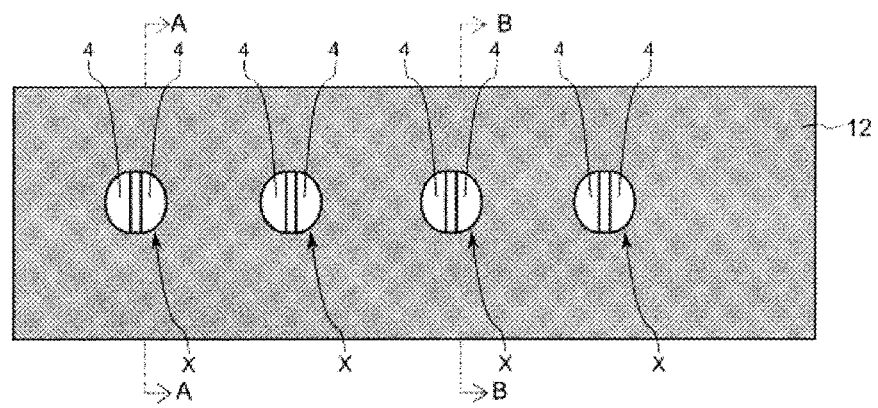
FIGS. 2B, 3B and 4B form a set of diagrams illustrating a schematic process of a method for manufacturing a light-emitting device according to an embodiment.
Figure 3B:
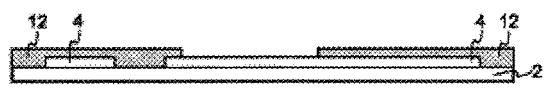
Figure 4B:

Next, the reflective member 12 is provided on the substrata 2 according to a method such as printing or the like as illustrated in FIG. 2B, 3B and 4B. The reflective member 12 has openings X at which the one or more wiring patterns 4 is/are exposed as illustrated in FIGS. 2B, 3B and 4B. The size of the area of the openings X is not particularly limited, but is preferably of a size that allows about two light-emitting elements to be mounted, so that new light-emitting elements that replace defective elements can be easily mounted.

(Third Process)

Figure 2C:
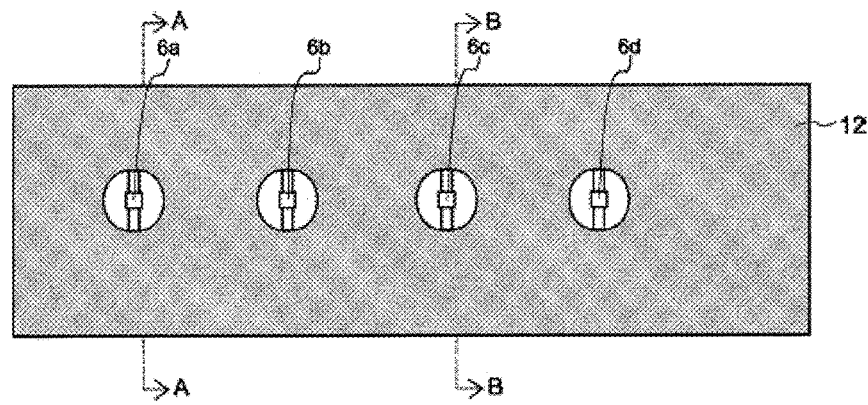
FIGS. 2C, 3C and 4C form a set of diagrams illustrating a schematic process of a method for manufacturing a light-emitting device according to an embodiment.
Figure 3C:
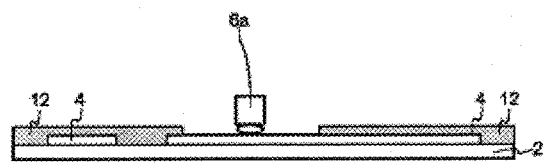
Figure 4C:
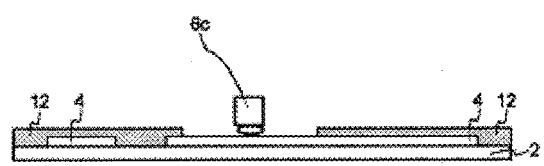

Next, as illustrated in FIGS. 2C, 3C and 4C, the plurality of light-emitting elements 6a, 6b, 6c, 6d is mounted on the one or more wiring patterns 4 that is/are provided, on the substrate 2. The light-emitting elements are ultrasonic-mounted on the one or more wiring patterns 4 in accordance with a flip-chip scheme using gold bumps.

(Fourth Process)

Next, the plurality of light-emitting elements 6a, 6b, 6c, 6d is determined to be good or detective.

(Fifth Process)

Figure 2D:
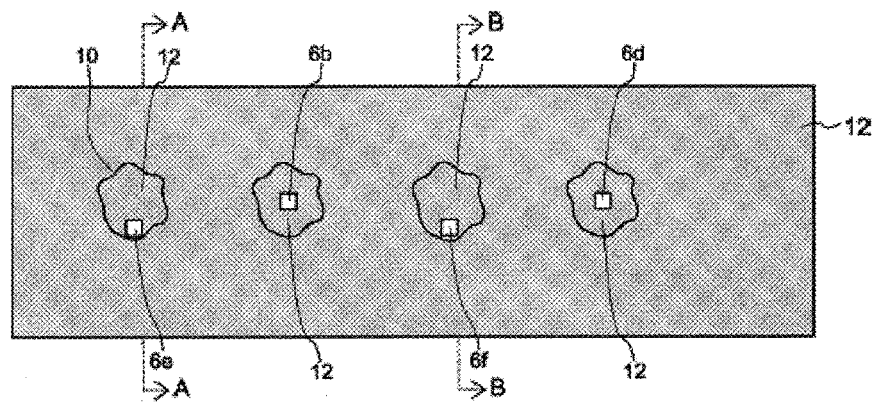
FIGS. 2D, 3D and 4D form a set of diagrams illustrating a schematic process of a method for manufacturing a light-emitting device according to an embodiment.
Figure 3D:
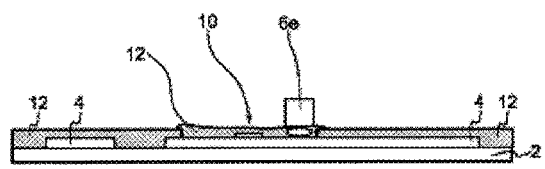
Figure 4D:
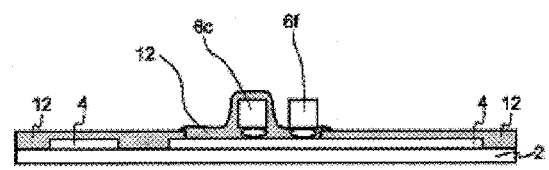

Next, as illustrated in FIGS. 2D, 3D and 4D, the new light-emitting elements 6e, 6f that replace the defective elements 6a, 6c among the plurality of light-emitting elements 6a, 6b, 6c, 6d are mounted on the same wiring pattern 4 on which the defective elements 6a, 6c are mounted.

The defective element 6a is removed from the substrate 2 before or after mounting of the new light-emitting elements 6e, 6f. The die bonding mark, die bonding material residue or the like that, remains after removal of the defective element 6a (for example, bump residue, alloy layer of gold and the material of the one or more wiring patterns 4) is regarded as a trace 10 that remains after removal of the defective element 6a. The trace 10 is covered by the reflective member 12. The defective element 6c is not removed from the substrate 2, but is covered by part of an underfill material, (example of the reflective member 12) that is filled in under the light-emitting element 6f.

(Sixth Process)

Figure 2E:
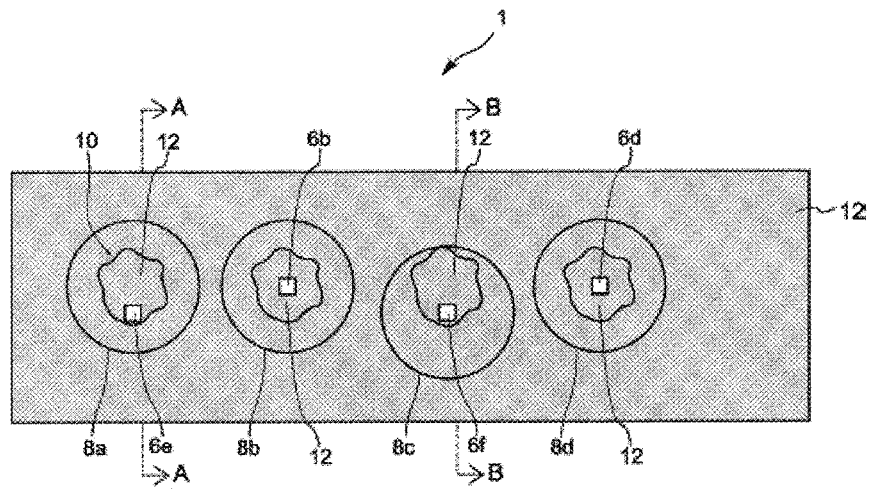
FIGS. 2E, 3E and 4E form a set of diagrams illustrating a schematic process of a method for manufacturing a light-emitting device according to an embodiment.
Figure 3E:
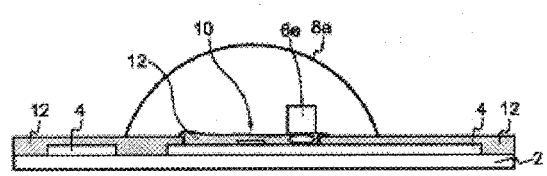
Figure 4E:
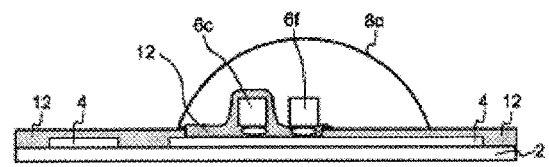

Next, as illustrated in FIGS. 2E, 3E and 4E, the light-emitting elements 6e, 6b, 6f, 6d are sealed by the respective sealing members 8a, 8b, 8c, 8d. The defective element 6c and the trace 10 that remains after removal of the defective element 6a are sealed by the same sealing members 8a, 8c by which the new light-emitting elements 6e, 6f are sealed. In the embodiment, the reflective member 12 that covers the trace 10 that remains after removal of the defective element 6a and the reflective member 12 that covers the defective element 6c are sealed by the same sealing members 8a, 8c by which the new light-emitting elements 6e, 6f are sealed.

An embodiment has been explained above, but the explanation relates merely to an example of the present invention, which is in no way limited to or by the explanation.

DENOTATION OF REFERENCE NUMERALS 1 light-emitting device
2 substrate
4 one or more wiring patterns
6a light-emitting element
6b light-emitting element
6c light-emitting element
6d light-emitting element
6e light-emitting element
6f light-emitting element
8a sealing member
8b sealing member
8c sealing member
8d sealing member
10 trace
12 reflective member
X opening

What is claim is:

1. A light-emitting device comprising:
   a substrate including one or more wiring patterns provided thereon;
   a trace of a defective element provided on one of the one or more wiring patterns, wherein the trace is a die bonding mark, a die bonding material residue, a wire bonding mark, and/or a wire residue;
   a plurality of light-emitting elements provided on the one or more wiring patterns, wherein the plurality of light-emitting elements includes a replacement light-emitting element mounted on the same wiring pattern on which the trace of the defective element is provided;
   a reflective member covering at least a part of the trace of the defective element; and
   a sealing member covering the replacement light-emitting element and at least a part of the reflective member covering at least a part of the trace of the defective element.

2. The light-emitting device according to claim 1, wherein a part the reflective member is provided under at least a part of the replacement light-emitting element.

3. The light-emitting device according to claim 1, wherein the reflective member is a white member.

4. The light-emitting device according to claim 1, wherein the plurality of light-emitting elements is ultrasonic-mounted on the one or more wiring patterns in accordance with a flip-chip scheme.

5. The light-emitting device according to claim 1, wherein the sealing member is selected from the group consisting of epoxy resin, silicone resin, or modified epoxy resin and modified silicone resin.

6. The light-emitting device according to claim 1, wherein the reflective member comprises a silicone resin, a modified silicone resin or a resist containing a material selected from the group consisting of titanium oxide, silicon oxide, barium sulfate, aluminum oxide, and a wavelength conversion member.

7. The light-emitting device according to claim 1, wherein the reflective member comprises an insulating resin containing a white filler or white powder and having a property of high reflectance.

8. The light-emitting device according to claim 1, wherein the reflective member is disposed so that at least a part of the replacement light emitting element is exposed from the reflective member.

9. The light-emitting device according to claim 1, wherein at least a part of a top surface and a side surface of the replacement light emitting element is exposed from.

10. The light-emitting device according to claim 1, wherein the defective element is an element that is not properly connected to the one or more wiring patterns. the reflective member.

11. A method for manufacturing a light-emitting device, comprising the steps of:
    mounting a plurality of light-emitting elements on one or more wiring patterns on a substrate;
    determining that at least one of plurality of light-emitting elements is defective; and then
    removing the defective element of the plurality of light-emitting elements, leaving a trace of the defective element on one of the one or more wiring patterns, wherein the trace is a die bonding mark, a die bonding material residue, a wire bonding mark, and/or a wire residue;
    mounting a replacement light-emitting element on the same wiring pattern on which the trace of the defective element is provided;
    covering at least part of the trace of the defective element with a reflective member; and
    sealing the replacement light-emitting element and at least a part of the reflective member covering at least a part of the trace of the defective element with a sealing member.

12. The method for manufacturing a light-emitting device according to claim 11, wherein a part the reflective member is provided under at least a part of the replacement light-emitting element.

13. The method for manufacturing a light-emitting device according to claim 11, wherein the reflective member is a white member.

14. The method for manufacturing a light-emitting device according to claim 11, wherein the plurality of light-emitting elements is ultrasonic-mounted on the one or more wiring patterns in accordance with a flip-chip scheme.

15. The method for manufacturing a light-emitting device according to claim 11, wherein the sealing member is selected from the group consisting of epoxy resin, silicone resin, or modified epoxy resin and modified silicone resin.

16. The method for manufacturing a light-emitting device according to claim 11, wherein the reflective member comprises a silicone resin, a modified silicone resin or a resist containing a material selected from the group consisting of titanium oxide, silicon oxide, barium sulfate, aluminum oxide, and a wavelength conversion member.

17. The method for manufacturing a light-emitting device according to claim 11, wherein the reflective member comprises an insulating resin containing a white filler or white powder and having a property of high reflectance.

18. The method for manufacturing a light-emitting device according to claim 11, wherein the reflective member is disposed so that at least a part of the replacement light emitting element is exposed from the reflective member.

19. The method for manufacturing a light-emitting device according to claim 11, wherein at least a part of a top surface and a side surface of the replacement light emitting element is exposed from the reflective member.

20. The method for manufacturing a light-emitting device according to claim 11, wherein the step of mounting the plurality of light-emitting elements on one or more wiring patterns on the substrate comprises providing a reflective material layer on the one or more wiring patterns on the substrate, the reflective material layer having openings exposing the one or more wiring patterns, a size of each of the openings allowing about two light-emitting elements to be mounted in each of the openings on the one or more wiring patterns on the substrate, and mounting one light-emitting element in each of the openings.

21. The method for manufacturing a light-emitting device according to claim 11, wherein the defective element is an element that is not properly connected to the one or more wiring patterns.

\* \* \* \* \*